United States Patent
Mai et al.

(10) Patent No.: US 8,489,945 B2
(45) Date of Patent: Jul. 16, 2013

(54) METHOD AND SYSTEM FOR INTRODUCING PHYSICAL DAMAGE INTO AN INTEGRATED CIRCUIT DEVICE FOR VERIFYING TESTING PROGRAM AND ITS RESULTS

(75) Inventors: Zhihong Mai, Singapore (SG); Pik Kee Tan, Singapore (SG); Guo Chang Man, Singapore (SG); Jeffrey Lam, Singapore (SG); Liang Choo Hsia, Singapore (SG)

(73) Assignee: Globalfoundries Singapore Pte, Ltd., Singapore (SG)

( * ) Notice: Subject to any disclaimer, the term of this patent is extended or adjusted under 35 U.S.C. 154(b) by 338 days.

(21) Appl. No.: 12/925,031

(22) Filed: Oct. 12, 2010

(65) Prior Publication Data

US 2012/0086468 A1   Apr. 12, 2012

(51) Int. Cl.
*G11C 29/00* (2006.01)

(52) U.S. Cl.
USPC .......................................... 714/723; 714/743

(58) Field of Classification Search
USPC .................................................. 714/723, 743
See application file for complete search history.

(56) References Cited

U.S. PATENT DOCUMENTS 6,971,055 B2 * 11/2005 Hung et al. ................... 714/743

* cited by examiner

Primary Examiner — Sam Rizk
(74) Attorney, Agent, or Firm — Robert D. McCutcheon

(57) ABSTRACT

According to an embodiment of the disclosure, a method verifies bitmap information or test data information for a semiconductor device. The method places a defect on a semiconductor device at an actual defect location using a laser to physically damage the semiconductor device. A logical address associated with the defect is detected and bitmap information or test data information is reviewed to determine an expected location corresponding to the logical address. Then, the accuracy of the bitmap information or the test data information is determined by comparing the actual defect location with the expected location. A deviation between the two indicates an inaccuracy.

20 Claims, 9 Drawing Sheets

METHOD AND SYSTEM FOR INTRODUCING PHYSICAL DAMAGE INTO AN INTEGRATED CIRCUIT DEVICE FOR VERIFYING TESTING PROGRAM AND ITS RESULTS

TECHNICAL FIELD

The present disclosure relates generally to the manufacture of semiconductor devices, and more particularly, to a method and system for introducing physical damage into an integrated circuit device for verifying a testing program and its results.

BACKGROUND

So-called "fabless" semiconductor companies specialize in the design and sale of hardware devices and semiconductor chips while outsourcing the fabrication or "fab" of these devices and chips to a specialized manufacturer called a foundry. Issues can arise when there is an error in the data communicated from the fabless company to the foundry—especially when both parties are unaware of the error.

Accordingly, there is a need to verify information sent from a fabless company to a foundry.

SUMMARY

According to an embodiment of the disclosure, a method verifies bitmap information or test data information for a semiconductor device. The method places a defect on a semiconductor device at an actual defect location using a laser to physically damage the semiconductor device. A logical address associated with the defect is detected and bitmap information or test data information is reviewed to determine an expected location corresponding to the logical address. Then, the accuracy of the bitmap information or the test data information is determined by comparing the actual defect location with the expected location. A deviation between the two indicates an inaccuracy.

According to another embodiment of the disclosure, a system verifies bitmap information or test data information for a semiconductor device. The system comprises a device that places a defect on a semiconductor device at an actual defect location and a device that detects the defect at a logical address. A processing device reviews bitmap information or test data information to determine an expected location corresponding to the logical address. The processing device also determines an accuracy of the bitmap information or the test data information by comparing the actual defect location with the expected location. A deviation between the two indicates an inaccuracy.

The foregoing has outlined rather broadly the features and technical advantages of the present disclosure so that those skilled in the art may better understand the detailed description that follows. Additional features and advantages of the present disclosure will be described hereinafter that form the subject of the claims. Those skilled in the art should appreciate that they may readily use the concept and the specific embodiment(s) disclosed as a basis for modifying or designing other structures for carrying out the same or similar purposes of the present disclosure. Those skilled in the art should also realize that such equivalent constructions do not depart from the spirit and scope of the claimed invention in its broadest form.

Before undertaking the Detailed Description below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely. Definitions for certain words and phrases are provided throughout this patent document, those of ordinary skill in the art should understand that in many, if not most instances, such definitions apply to prior uses, as well as future uses, of such defined words and phrases.

BRIEF DESCRIPTION OF THE DRAWINGS

For a more complete understanding of the present disclosure, and the advantages thereof, reference is now made to the following descriptions taken in conjunction with the accompanying drawings, wherein like numbers designate like objects, and in which.

DETAILED DESCRIPTION

Figure 1:
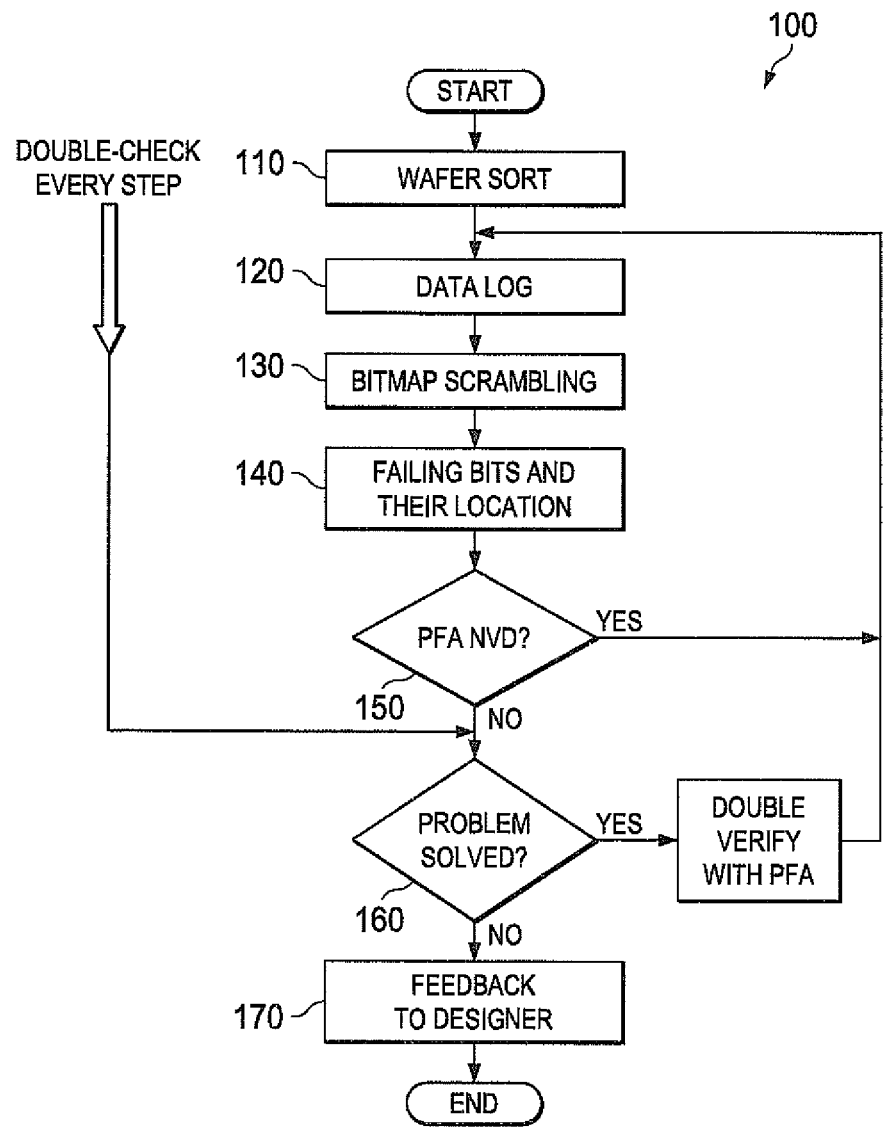
FIG. 1 illustrates a conventional process for laser assisted verification on a memory bitmap.

FIGS. 1 through 10 and the various embodiments used to describe the principles of the present disclosure in this patent document are by way of illustration only and should not be construed in any way to limit its scope. Those skilled in the art will understand that the principles described herein may be implemented with any type of suitably arranged device and/or devices.

To simplify the drawings, reference numerals from previous drawings will sometimes not be repeated for structures that have already been identified.

Fault isolation and failure analysis play an important role in yield enhancement before ramp up of an actual production of semiconductors. Integrated circuit (IC) technologies are not only decreasing in size, but are also increasing in complexity, for example, by becoming more and more complicated in function with an ever-increasing number of transistors. Given such reduced size and increased complexity in ICs, fault isolation becomes challenging, especially in a mixed signal device, which contains logic function, analog, and memories.

In the prototyping phase of semiconductor production, wafer sort and fault isolation may be set up at the same time as the set up of process development and yield improvement. Fault isolation in a foundry may include, among other techniques, memory bitmapping, TetraMAX® for automatic test pattern generation (ATPG), integrated circuit quiescent current (IDDQ) testing, power short and continuity failure testing, and the like. Additionally, some fabless companies may require circuitry verification for silicon debugging.

Of the above-referenced testing procedures, many consider memory bitmap and logic circuitry verification to be the most challenging. In a foundry, most of the critical processes issues may be identified through bitmap failure analysis (FA) and ATPG FA.

FIG. 1 illustrates a conventional process 100 for laser assisted verification on a memory bitmap. A bitmap scrambling specification generally indicates how a logical address and input/output information corresponding to that logical address map to a physical location on the semiconductor (e.g., a row and column). When failure analysis is conducted and failure of a particular "bit" is detected, the bitmap scrambling specification may be used to determine the physical location of the "bit." Although specific steps will be shown with reference to process 100, it should be understood that other processes have more, less, or different steps associated therewith. And, such other processes may avail from teachings of this disclosure.

The conventional process 100 may include a wafer sort at step 110, which may include electrical testing of the various components on the semiconductor. As one non-limiting example, a variety of different devices may probe components on the semiconductor to determine whether they are operating correctly. After wafer sorting at step 110, the process 100 may include consulting the data log and bitmap scrambling information at steps 120 and 130. Using the information from steps 120 and 130, a determination may be made as to whether there are failing bits along with the locations (e.g., as indicated by the bitmap scrambling information) of such failing bits at step 140.

At step 150, there may be a determination of whether the defect types of the physical failure analysis (PFA) samples are invisible—known as a non-visual defect (NVD). Such a scenario may arise when a component has been determined not to be operating correctly, but there is no physical evidence that there is anything wrong with the component. If an NVD is believed to be present, the process 100 may return back to step 120. If not, the process 100 may proceed to step 160. In returning to step 120, different techniques may be used to confirm whether or not the failing component with an NVD is valid.

At step 160, the process 100 may determine whether or not any encountered problems have been solved. As one example, an NVD may be encountered because bitmap scrambling information is incorrect. If the correct bitmap scrambling information is provided, the previous NVD may no longer be a problem. If encountered problems have been solved, then the process 100 may double verify with PFA and return to step 120. If not, feedback may be provided to the designer at step 170 to inform the designer of the problem.

Throughout process 100, there may be a double verification at each step (as indicated by the arrow to the left of process 100) to ensure that no errors are introduced as a result of failure to properly execute a step.

Failure to successfully execute a bitmap setup may be caused by one or the following possibilities (some of which are addressed in the conventional process 100 described above):

1. The defect types of the samples are invisible—a non-visual defect (NVD). In such a scenario, one could use nanoprobing, conductive atomic force microscopy (CAM or other techniques to confirm the NVD; however, there is no guarantee that such techniques will confirm an NVD—especially when the NVD is a result of incorrect bitmap scrambling.
2. The defect types of the samples may need other PFA methods. In such a scenario, verifying the bitmap setup with different PFA methods may not only be time consuming, but may also result in a delay of the bitmap setup. Furthermore, there is no guarantee that such other PFA methods will actually determine the defect.
3. The bitmap scrambling is incorrect and needs verification by the fabless company or the designer. In such a scenario, some fabless companies or designers will insist that they provided the correct bitmap scrambling information unless one can show them otherwise that they have not.
4. The testing program or data log is incorrect.
5. The bitmap software has errors.
6. Other unknown reasons.

When errors are the result of item 3 above (bitmap scrambling is incorrect), unfortunately, other problems are typically explored first to avoid offending a designer or fabless company and their erroneous data.

Given the above difficulties, certain embodiments teach intentionally damaging a portion of the semiconductor device (e.g., with a laser) at a specific location (laser zapped location) and then testing the device to determine if the detected error location (e.g., as indicated by a bitmap scrambling location) corresponds to the laser zapped location. As an illustrative example, for SRAM, one or more memory cells may be intentionally damages. Then, with test data log, we can determine whether there is a match between the damaged location and the pointed location from bitmap. In certain embodiments, this will help analysts in determining whether a bitmap set up is correct or if there are errors in the testing data log. According to certain embodiments, this technique of introducing artificial errors at laser-zapped locations (e.g., intentional damage or errors) can also be used to verify the correctness of the pointed location of a logic circuitry from test data.

Figure 2:
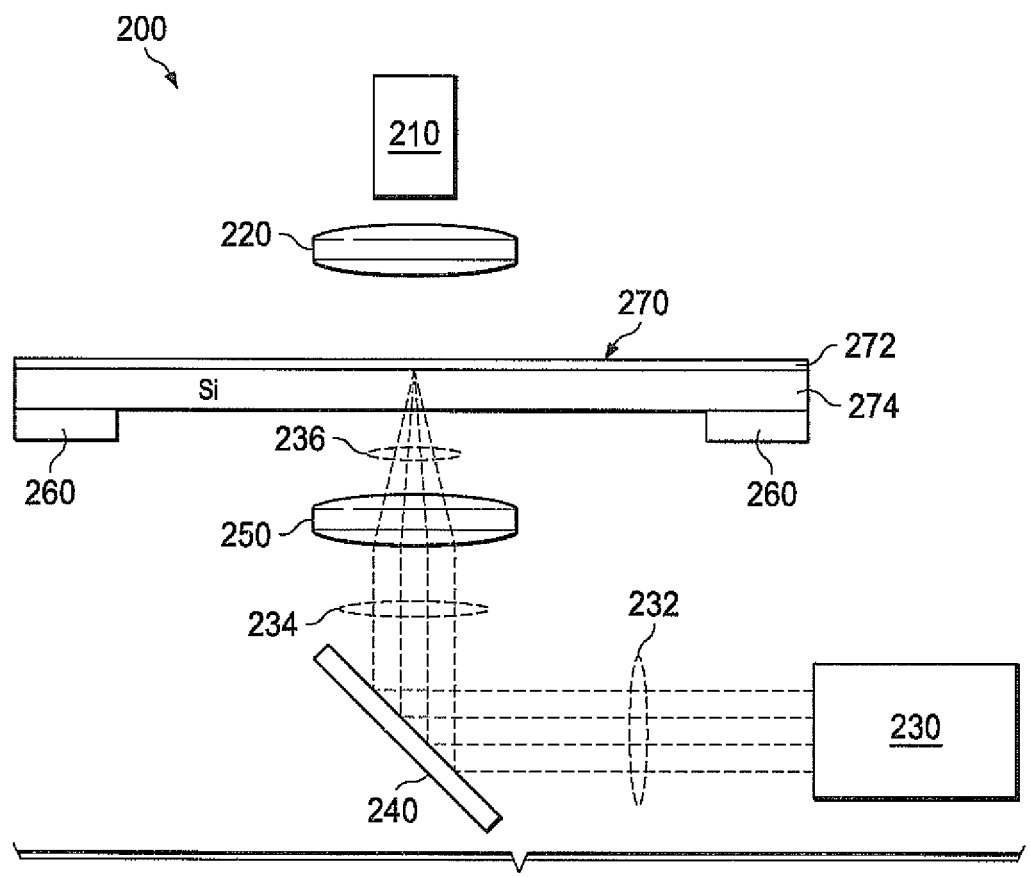
FIG. 2 illustrates a system for creating a defect in a semiconductor or integrated circuit, according to an embodiment of the disclosure.

FIG. 2 illustrates a system 200 for creating a defect in a semiconductor device (or integrated circuit) according to an embodiment of the disclosure. The system 200 in this embodiment includes a charge couple device (CCD) camera 210, an optical microscope 220, an infrared laser 230, a reflection mirror 240, an infrared lens 250, and a precision stage system 260. Although specific components have been shown in this embodiment, other embodiments may use more, less, or different components. Additionally, although system 200 will be illustratively shown with reference to particular materials and types of semiconductor devices or integrated circuits, the system 200 may be used with other materials and other types of semiconductors.

The system 200 generally places a defect in, for example, a wafer or design under testing. As an illustrative example for this particular embodiment, an aluminum coated silicon wafer 270 is shown. The aluminum coated silicon wafer 270 includes a front side 272, which includes the aluminum, and a back side 274.

The infrared laser 230 produces a short-pulse of laser energy 232, which is reflected off reflection mirror 240 yielding reflected laser energy 234. The reflected laser energy 234 is then passed through an infrared lens 250 which focuses the reflected laser energy 234 to yield focused laser energy 236. The focused laser energy 236 ultimately damages the aluminum coated silicon wafer 270, in particular the aluminum, on the front side 272. In particular embodiments, the size of the damage area created by focused laser energy 236 can be modified by adjusting infrared lens 250. Although this particular embodiment shows a "back-side" zapping of the wafer or design under testing, a "front-side zapping" may also occur by having the laser energy enter the wafer or design under testing from the front side. In particular embodiments, such "front-side zapping" may be particularly feasible when the wafer or design under testing has thick metal layers.

The damage to the aluminum on the front side 272 (including its location) may be observed using a well-aligned optical microscope 220 and the CCD camera 210. In the embodiment shown, the CCD camera 210 may be a silicon CCD camera used to observe the "back-side" zapping. In other embodiments, for example, "front-side" zapping embodiments, the CCD camera 210 may be an infrared CCD camera. Although a CCD camera 210 is shown in this embodiment, other embodiments may use other types of imaging devices.

The precision stage system 260, which may be controlled by a computer (e.g., FIG. 10), functions to provide leveling and precise movement of the aluminum coated silicon wafer 270 to allow zapping at one or more locations on the aluminum coated silicon wafer 270. In particular embodiments, this precision zapping may avoid breaking the wafer—even wafers that are not polished.

Figure 10:
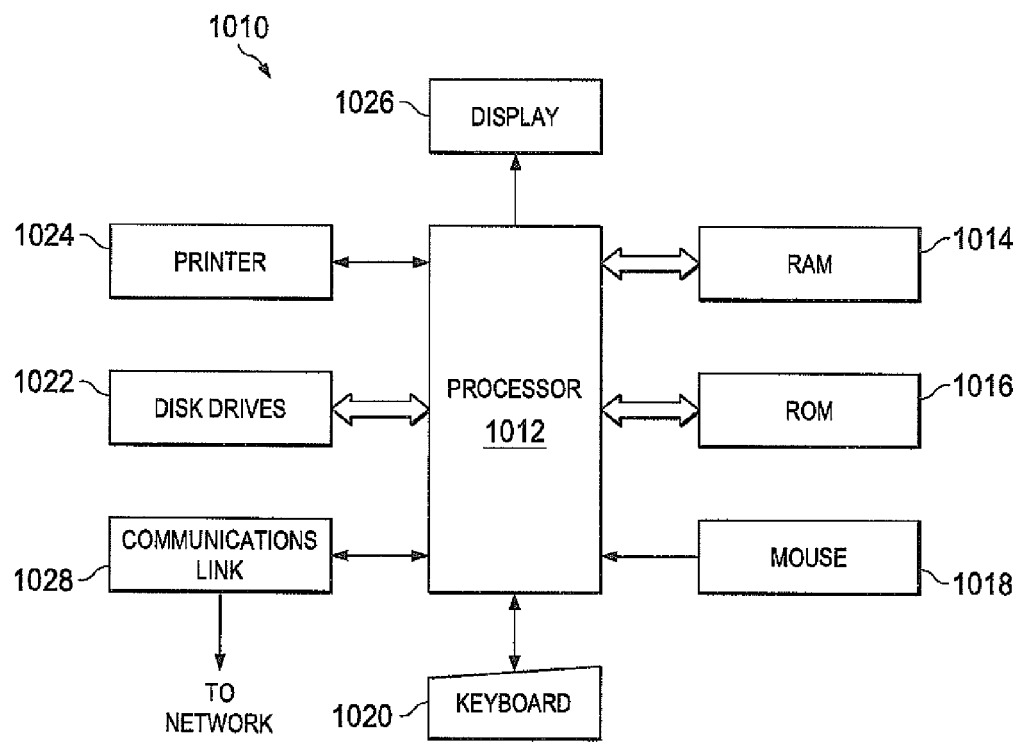
FIG. 10 is an embodiment of a general purpose computer that may be used as a controller in connection with other embodiments of the disclosure.

Each of the respective components in the system 200 may receive instructions and/or provide feedback to a computer (e.g., FIG. 10). In the embodiment of FIG. 2, the spacing accuracy of the system may be on the order of 5 μm, which is good enough to point to a specific location in memory blocks. In other embodiments, the accuracy may be lower or higher than 5 μm. For higher space accuracy in other embodiments, high power optical microscopes or other microscopy techniques may be applied.

In certain embodiments, the thermal diffusion length of the heating effect induced by a pulsed laser will be short and the damaged area can be small. The thermal diffusion length of a laser such as that shown in FIG. 2 is described with reference to FIGS. 3A-3B.

Figure 3A:
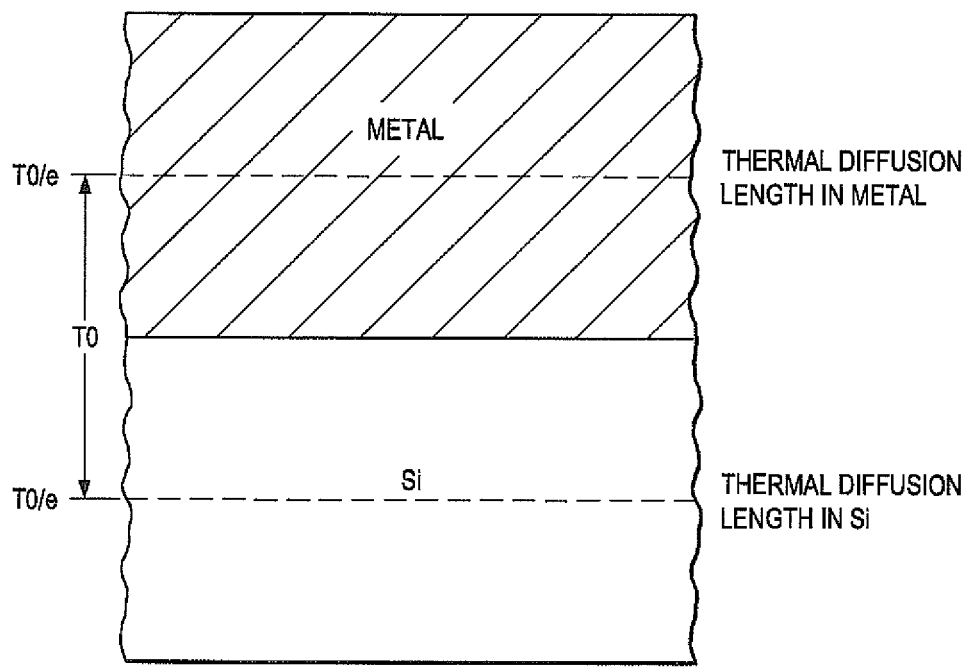
FIGS. 3A and 3B show the damaged area of a wafer, according to an embodiment of the disclosure.
Figure 3B:
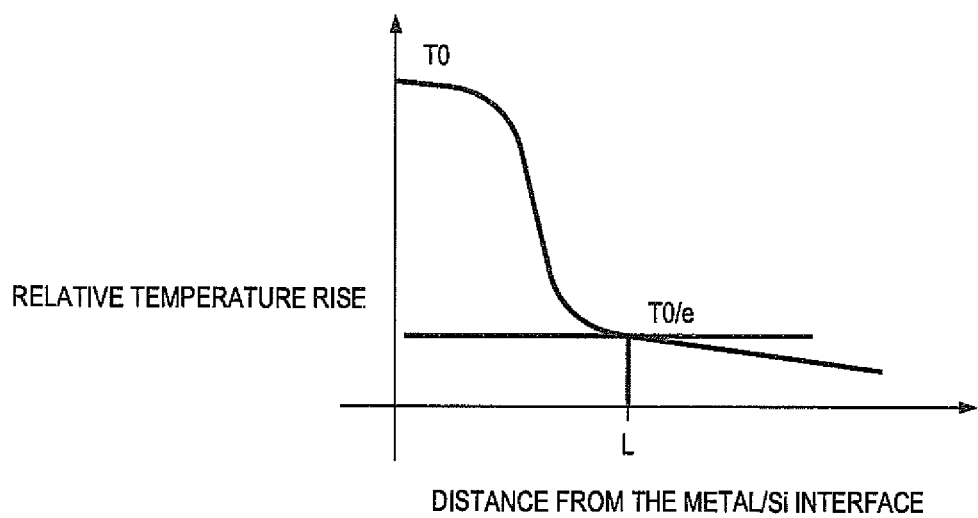

FIGS. 3A and 3B show an intentionally damaged area of the wafer (e.g., semiconductor device), according to an embodiment of the disclosure. Using a pulsed neodymium-doped yttrium aluminum garnet (Nd:YAG) laser with a duration of 7 nanoseconds, the thermal diffusion length (T0/e) is about 50 nm from the metal to silicon interface (designated by T0). With reference to FIGS. 3A and 3B, it can been seen that a pulsed Nd:YAG laser with a duration of 7 ns can be designed to only damage the front end of the line (FEOL) structures or the lowest interconnect layer. The light absorbing materials in the Si-based IC may include salicide, metal (e.g., W tungsten) contact, and metal interconnects. In particular embodiments, this will be applicable for both front side and back side zapping. One may simply flip the wafer and change the CCD of the microscope to IR microscope, and the laser can be at the wavelength of UV, visible light and IR.

As described in this specification, after the wafers or DUT (device under test) are zapped, they may be tested. From the test data log and bitmap scrambling, the bitmap locations may be compared with the actual laser damaged locations. If they match, the bitmap setup may be successful. If not, one or both of the test data log and bitmap scrambling may need to be checked for accuracy.

Figure 4:
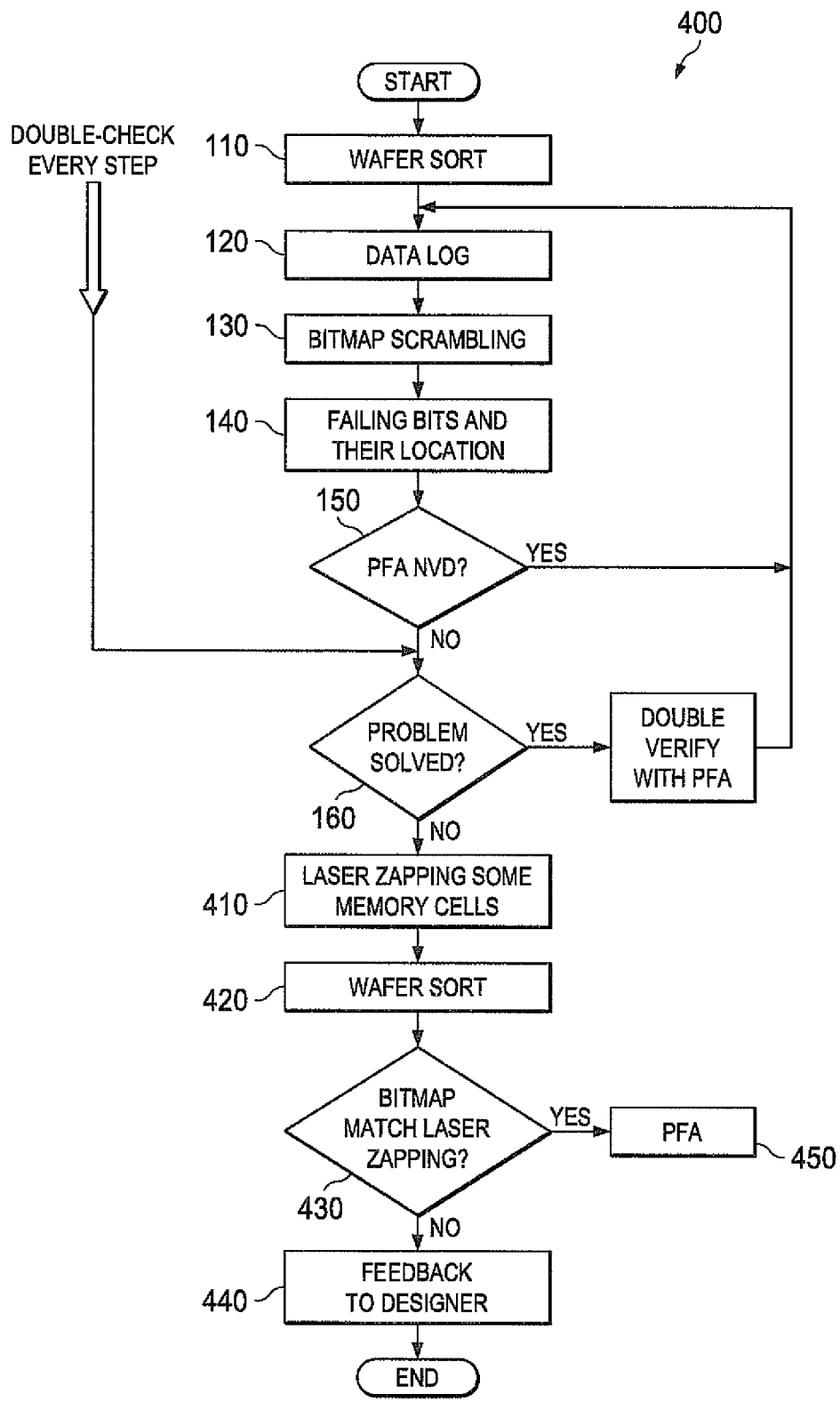
FIG. 4 illustrates a verification process, according to an embodiment of the disclosure.

FIG. 4 illustrates a process 400, according to an embodiment of the disclosure. The process 400 may include steps 110, 120, 130, 140, 150, and 160 as described above with reference to FIG. 1. However, the process 400 also includes new steps 410, 420, 430, and 440. Upon a determination that a problem has not been solved at step 160, the process 400 may proceed to a zapping of certain cells, for example, using the system 200 of FIG. 2 or other systems. As an example, in particular embodiments, the laser focus may be several micrometers and cover several to tens of cells in a 45 nanometer SRAM. Other embodiments may use other laser focuses and zap more than or less than this number of cells.

After zapping at step 410, a wafer sort may occur at step 420 (similar to wafer sort 110) followed by a determination at step 430 of whether the bitmap locations match the laser zapping locations. This may occur or be accomplished by cross-referencing the actual defect location (e.g., as caused by the zapping at step 410 and measured by a CCD camera or the like) with an expected defect location (e.g., provided by bitmap scrambling information) corresponding to the logical address for the detected failed component. If so, the process 400 may proceed to step 450 where physical failure analysis (PFA) can occur. If not, the process 400 may proceed to step 440 where feedback is provided to a designer or fabless company. Unlike step 170 of process 100, step 440 of process 400 may include evidence suggesting that the data (e.g., bitmap scrambling information) is incorrect. This is because the location of artificial errors (e.g., intentional damage) introduced through zapping did not match the bitmap location information that may have been provided by the designer or fabless company.

Thus, by using the laser-assisted bitmap verification flow as illustrated by process 400, one can clearly identify whether there is an issue in memory scrambling, which in turn, may ease discussions with designers or fabless companies.

Although this technique has been described with reference to memory bitmap verification, it may also be used for logic circuitry verification in the same manner described above. In particular, a location of an actual defect can be introduced followed by a detection of the defect and a review of bitmap information to determine whether an expected location corresponding to the logical address(es) correspond to the actual defect location.

Figure 5:
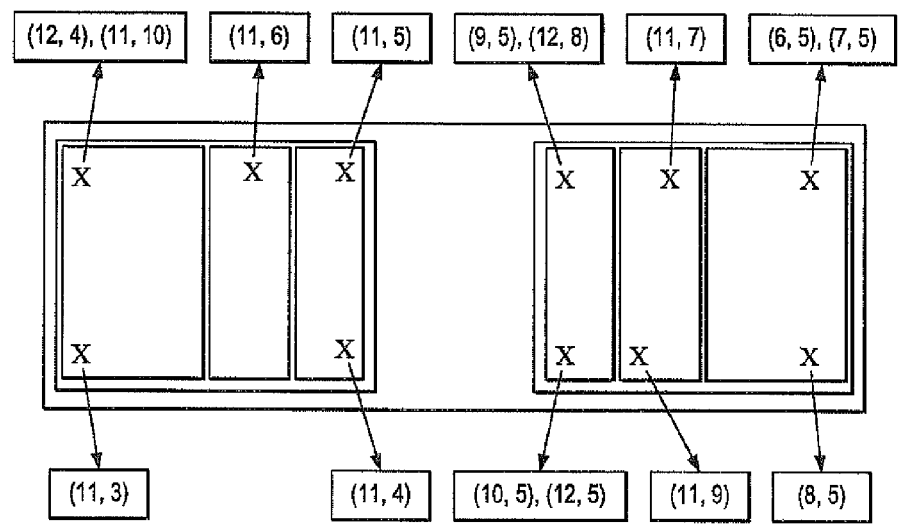
FIG. 5 illustrates a selection of a laser zapping location, according to an embodiment of the disclosure.

FIG. 5 illustrates a selection of a laser zapping location, according to an embodiment of the disclosure. The locations for laser zapping may be selected according to the structure of the semiconductor device or IC. As an illustrative example, the semiconductor device may include memory. To identify the logic bits of a memory, the following physical identification number may be given: blocks, rows and columns. As illustrated in FIG. 5, at least four corners of a block are selected for zapping. Each label (pointed to by an arrow) is a die number and where two labels are given for an arrow, two dies are zapped at the same location. For example, (12, 4), (11, 10) corresponds to different dies with a zapping of two such dies at the same location.

Figure 6A:
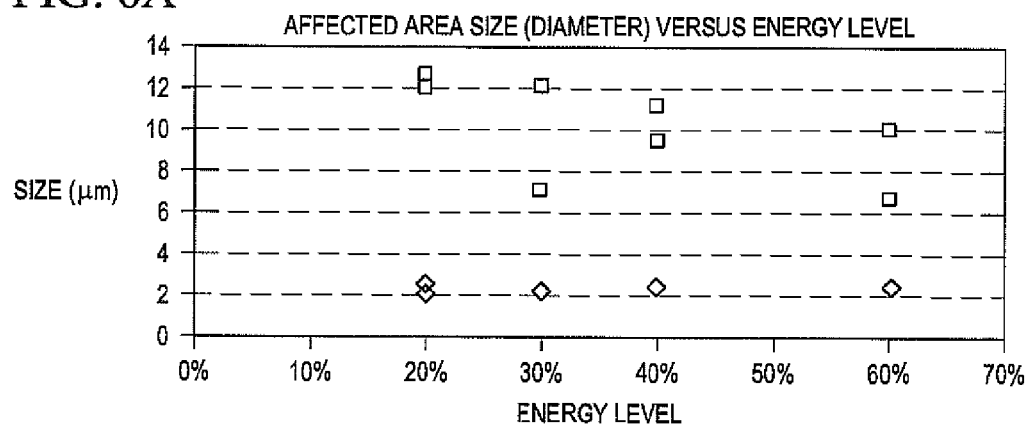
FIGS. 6A, 6B, and 6C show calibration information, according to an embodiment of the disclosure.
Figure 6B:
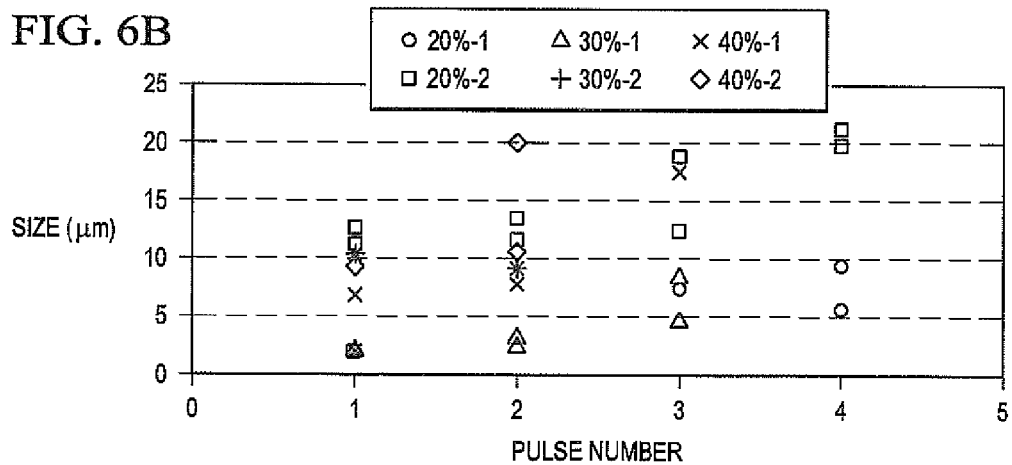
Figure 6C:
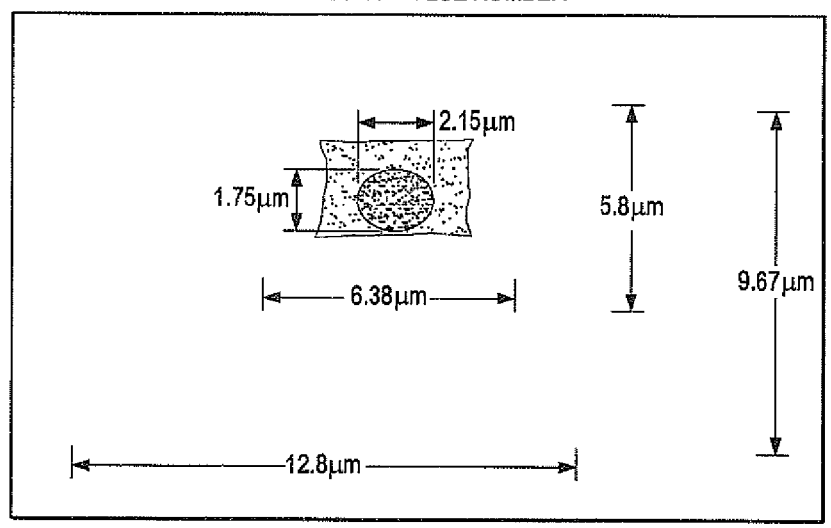

FIGS. 6A, 6B, and 6C show calibration information, according to an embodiment of the disclosure. Before working on actual samples, laser parameters may be calibrated for zapping. The goal is to damage the device to an extent where an error will be detected. For example, as seen in FIG. 6C, the damaged area on an unprocessed sample is about 5 μm, which is enough damage for bitmap verification. Accordingly, the laser can be calibrated to damage the same size. In other embodiments, the damage size may be different.

FIG. 6A shows a correlation between a size and energy level whereas FIG. 6B shows a correlation between the size and pulse number. FIGS. 6A and 6B correspond to the lasers and materials for the embodiments described with reference to FIGS. 2-5. Depending on the laser used and the material damaged, the calibration parameters may be varied.

Figure 7:
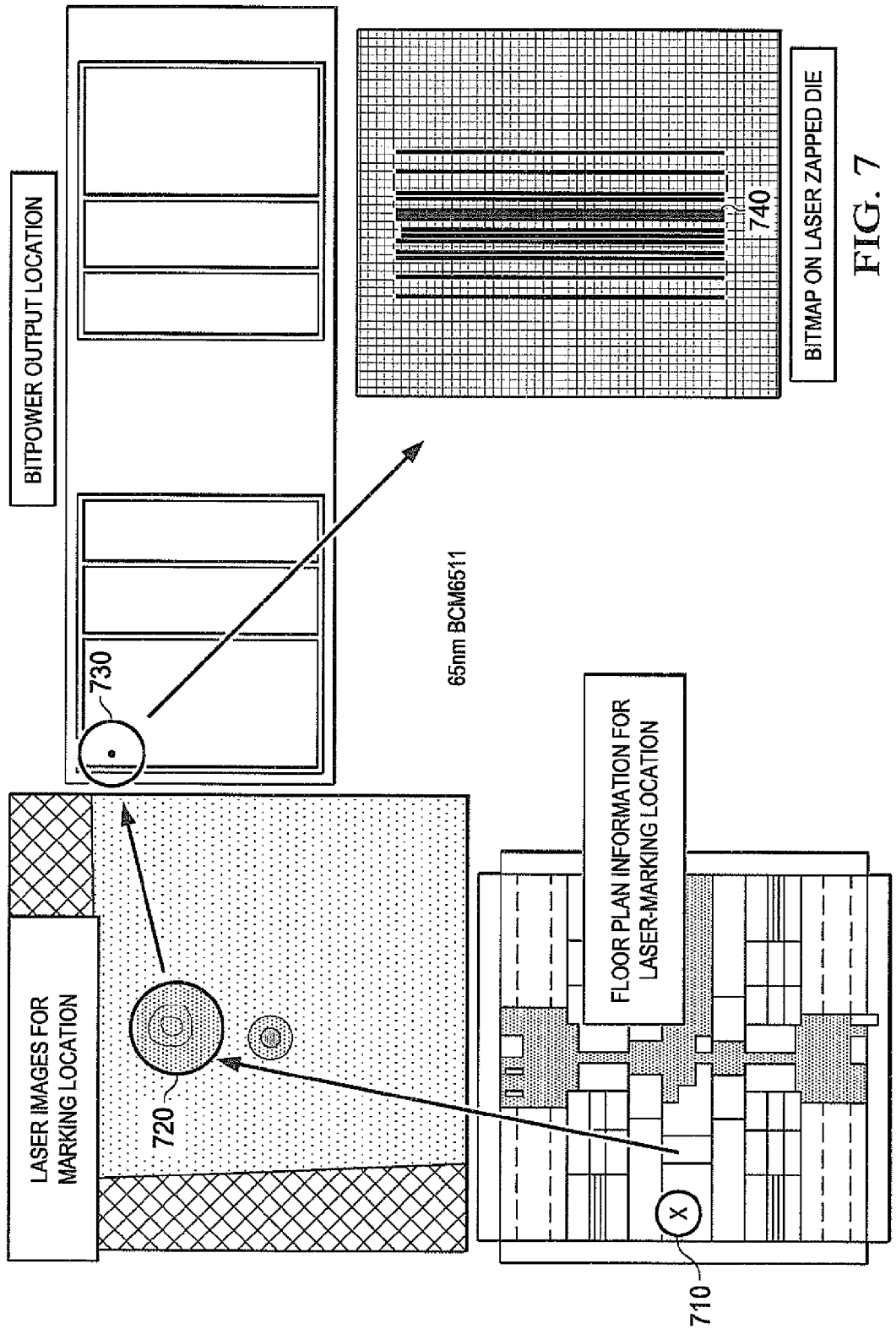
FIG. 7 illustrates the bitmap verification result of a device on an initial bitmap scrambling, according to an embodiment of the disclosure.

FIG. 7 illustrates a bitmap verification result of a device on initial bitmap scrambling, according to an embodiment of the disclosure. Labels 710, 720 and 730 are the same location in different images. Label 710 is the location in a graphic data system (GDS) layout, label 720 is the backside image of the given location in 710, and 730 is the bitmap location converted from testing data of the given location in 710. The image corresponding to label 720 is a high magnification image. The zapping area is small covering several bits only with a circular distribution. The image corresponding to label 740 is a high magnification (Zoom In) image corresponding to label 730. The lines corresponding to label 740 shows multiple full column failures (straight lines in the bitmap), which is thousands of bits damaged.

Figure 8:
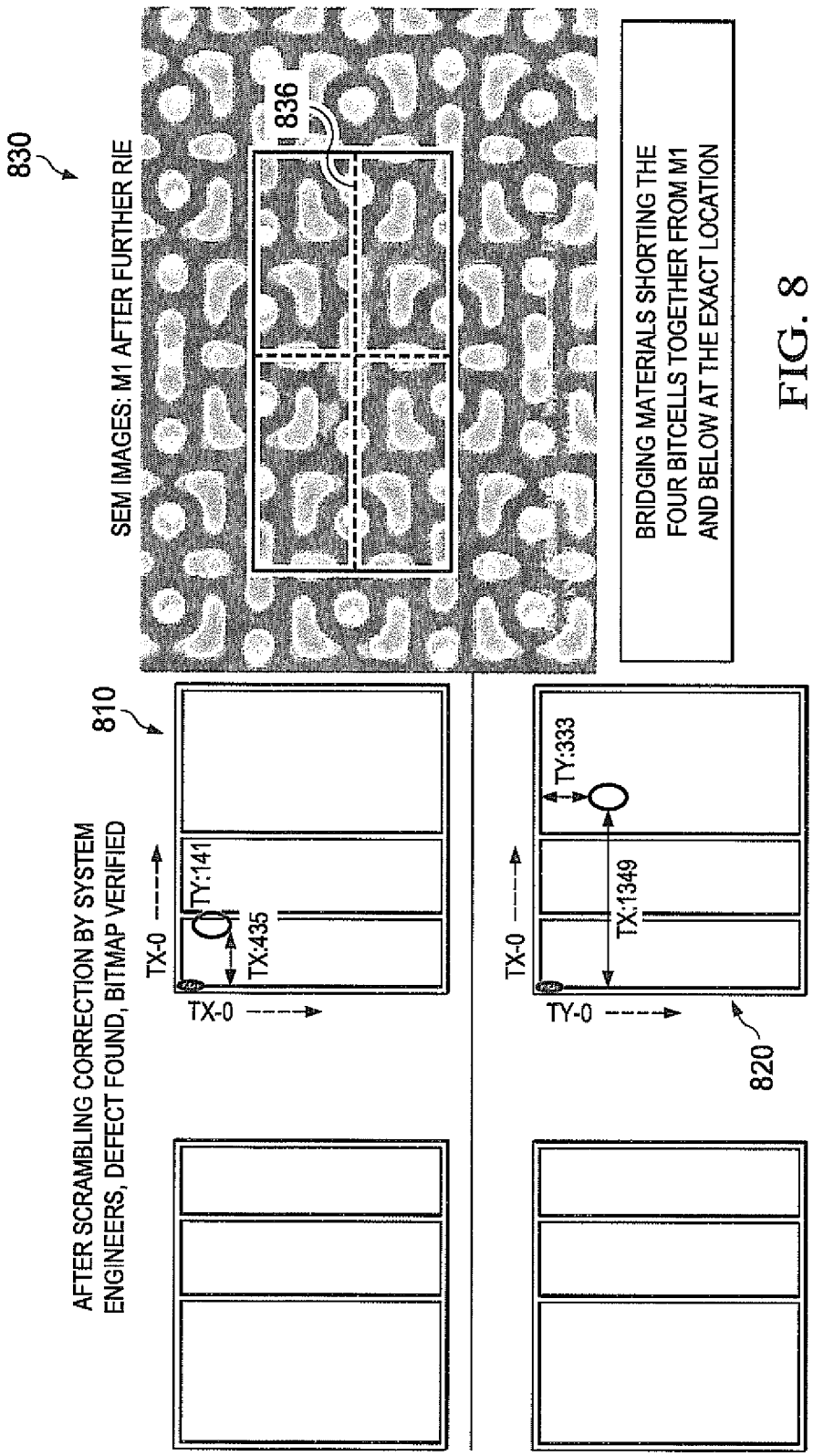
FIG. 8 illustrates a verification result after a memory scrambling correction, according to an embodiment of the disclosure.

FIG. 8 illustrates a verification result after a memory scrambling correction, according to an embodiment of the disclosure. In particular, view 810 shows the failing location at the verified block, view 820 shows a failing location at a non-verified block, and view 830 shows a scanning electron microscope (SEM) image around the failing location. In view 830, a box 836 shows the exact failing cell.

Figure 9:
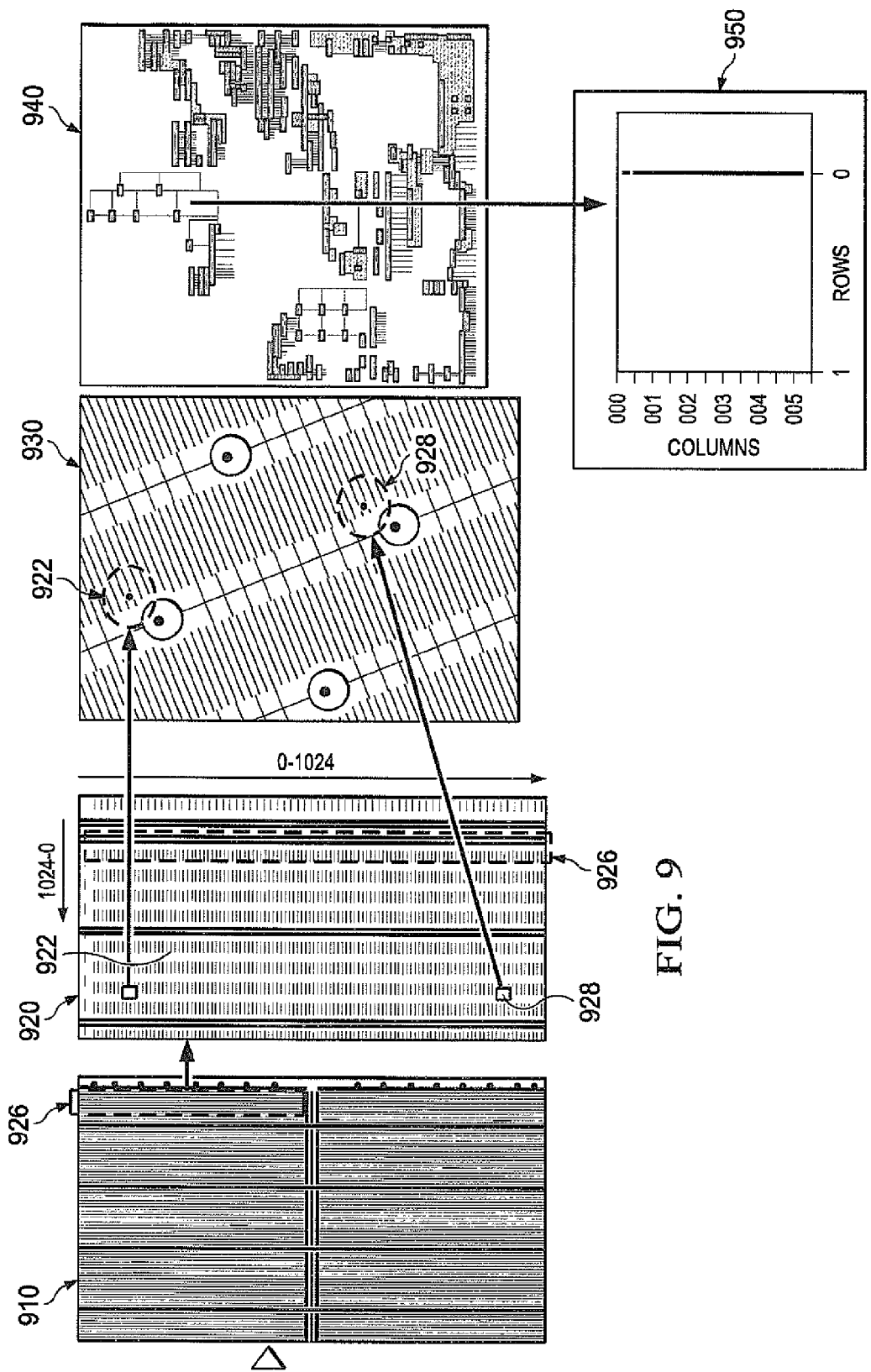
FIG. 9 illustrates a non-match of a bitmap location and a zapping location, according to an embodiment of the disclosure.

FIG. 9 illustrates another non-match of a bitmap location and a zapping location, according to an embodiment of the disclosure. Locations 922 and 928 are the laser zapped locations (as shown in views 920 and 930). However, upon testing the die and detecting the error caused by the laser zapped location, the bitmap scrambling information and test data log indicate that the location of the error is in row 0, which is indicated by box 926 in views 910 and 920 and also seen in views 940 and 950. Because the bitmap scrambling location of the error did not provide the same location as the zapping location, we know that the bitmap scrambling information and/or the test data information is incorrect. Accordingly, we can seek correct bitmap scrambling information and/or test data information.

FIG. 10 is an embodiment of a general purpose computer 1010 that may be used as a controller in connection with other embodiments of the disclosure to carry out any of the above-referenced functions. General purpose computer 1010 may generally be adapted to execute any of the known OS2, UNIX, Mac-OS, Linux, Android and/or Windows Operating Systems or other operating systems. The general purpose computer 1010 in this embodiment includes a processor 1012, a random access memory (RAM) 1014, a read only memory (ROM) 1016, a mouse 1018, a keyboard 1020 and input/output devices such as a printer 1024, disk drives 1022, a display 1026 and a communications link 1028. In other embodiments, the general purpose computer 1010 may include more, less, or other component parts. Embodiments of the present disclosure may include programs that may be stored in the RAM 1014, the ROM 1016 or the disk drives 1022 and may be executed by the processor 1012 in order to carry out functions described herein. The communications link 1028 may be connected to a computer network or a variety of other communicative platforms including, but not limited to, a public or private data network; a local area network (LAN); a metropolitan area network (MAN); a wide area network (WAN); a wireline or wireless network; a local, regional, or global communication network; an optical network; a satellite network; an enterprise intranet; other suitable communication links; or any combination of the preceding. Disk drives 1022 may include a variety of types of storage media such as, for example, floppy disk drives, hard disk drives, CD ROM drives, DVD ROM drives, magnetic tape drives or other suitable storage media. Although this embodiment employs a plurality of disk drives 1022, a single disk drive 1022 may be used without departing from the scope of the disclosure.

Although FIG. 10 provides one embodiment of a computer that may be utilized with other embodiments of the disclosure, such other embodiments may additionally utilize computers other than general purpose computers as well as general purpose computers without conventional operating systems. Additionally, embodiments of the disclosure may also employ multiple general purpose computers 1010 or other computers networked together in a computer network. Most commonly, multiple general purpose computers 1010 or other computers may be networked through the Internet and/or in a client server network. Embodiments of the disclosure may also be used with a combination of separate computer networks each linked together by a private or a public network.

Several embodiments of the disclosure may include logic contained within a medium. In the embodiment of FIG. 10, the logic includes computer software executable on the general purpose computer 1010. The medium may include the RAM 1014, the ROM 1016, the disk drives 1022, or other mediums. In other embodiments, the logic may be contained within hardware configuration or a combination of software and hardware configurations. The logic may also be embedded within any other suitable medium without departing from the scope of the disclosure.

It will be understood that well known processes have not been described in detail and have been omitted for brevity. Although specific steps, structures and materials may have been described, the present disclosure may not limited to these specifics, and others may substituted as is well understood by those skilled in the art, and various steps may not necessarily be performed in the sequences shown.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. A method of verifying bitmap information or test data information for a semiconductor device, the method comprising:
   placing a defect on a semiconductor device at an actual defect location by physically damaging the semiconductor device with a laser at the actual defect location;
   detecting the defect at a logical address;
   reviewing at least one of bitmap information or test data information to determine an expected location corresponding to the logical address;
   determining an accuracy of the at least one of the bitmap information or the test data information by comparing the actual defect location with the expected location, a deviation between the actual defect location and the expected location indicating that the at least one of the bitmap information or the test data information is incorrect.

2. The method of claim 1, wherein the semiconductor device is a wafer.

3. The method of claim 1, wherein the semiconductor includes logic circuitry and the defect is introduced within the circuitry.

4. The method of claim 1, wherein detecting the defect at the logical address is carried out using a test probing technique.

5. The method of claim 1, wherein the laser produces a pulse of laser energy that induces a heating effect having a thermal diffusion length.

6. The method of claim 5, wherein the laser comprises a pulsed neodymium-doped yttrium aluminum garnet (Nd:YAG) laser.

7. A method of verifying bitmap information or test data information for a semiconductor device, the method comprising:
   placing a defect on a semiconductor device at an actual defect location, wherein placing a defect on the semiconductor device is carried out with a laser;
   detecting the defect at a logical address;
   reviewing at least one of bitmap information or test data information to determine an expected location corresponding to the logical address;
   determining an accuracy of the at least one of the bitmap information or the test data information by comparing the actual defect location with the expected location, a deviation between the actual defect location and the expected location indicating that the at least one of the bitmap information or the test data information is incorrect.

8. The method of claim 7, wherein placing a defect on the semiconductor device includes physically damaging at least a portion of the semiconductor device.

9. The method of claim 7, wherein the semiconductor device is a wafer.

10. The method of claim 7, wherein the semiconductor includes logic circuitry and the defect is introduced on the circuitry.

11. The method of claim 7, wherein detecting the defect at the logical address is carried out using a test probing technique.

12. The method of claim 7, wherein
   the semiconductor device is silicon coated with metal, the metal being on the front side and the silicon being on the back side, and
   placing a defect on the semiconductor device includes introducing damage to the metal from the front side.

13. The method of claim 7, wherein
   the semiconductor device is silicon coated with metal, the metal being on the front side and the silicon being on the back side, and
   placing a defect on the semiconductor device includes introducing damage to the metal from the back side.

14. A system for verifying bitmap information or test data information for a semiconductor device, the system comprising:
   a laser device operable to place a defect on a semiconductor device at an actual defect location;
   a device operable to detect the defect at a logical address; and
   a processing device operable to:
      review at least one of bitmap information or test data information to determine an expected location corresponding to the logical address, and
      determine an accuracy of the at least one of the bitmap information or the test data information by comparing the actual defect location with the expected location, a deviation between the actual defect location and the expected location indicating that the at least one of the bitmap information or the test data information is incorrect.

15. The system of claim 14, wherein the device operable to place a defect on the semiconductor device at an actual defect location physically damages at least a portion of the semiconductor device.

16. The system of claim 14, wherein the semiconductor device is a wafer.

17. The system of claim 14, wherein the semiconductor includes logic circuitry and the defect is introduced on the circuitry.

18. The system of claim 14, wherein the device operable to detect the defect at the logical address is a test probe.

19. The system of claim 14, wherein
   the semiconductor device is silicon coated with metal, the metal being on the front side and the silicon being on the back side, and
   the device that places the defect on the semiconductor device introduces damage to the metal from the back side.

20. The system of claim 14, wherein
   the semiconductor device is silicon coated with metal, the metal being on the front side and the silicon being on the back side, and
   the device that places the defect on the semiconductor device introduces damage to the metal from the front side.

* * * * *